United States Patent [19]

Lepselter

[11] 4,300,152
[45] Nov. 10, 1981

[54] COMPLEMENTARY FIELD-EFFECT TRANSISTOR INTEGRATED CIRCUIT DEVICE

[75] Inventor: Martin P. Lepselter, Summit, N.J.

[73] Assignee: Bell Telephone Laboratories, Incorporated, Murray Hill, N.J.

[21] Appl. No.: 138,228

[22] Filed: Apr. 7, 1980

[51] Int. Cl.³ .............. H01L 27/04; H01L 29/78; H01L 29/56
[52] U.S. Cl. .................................. 357/42; 357/15; 357/23; 357/38
[58] Field of Search ............... 357/42, 15, 38, 40, 357/23

[56] References Cited

U.S. PATENT DOCUMENTS

| | | |
|---|---|---|
| 3,590,471 | 7/1971 | Lepselter et al. ............ 357/15 |
| 3,708,360 | 1/1973 | Wakefield, Jr. et al. ...... 357/15 |
| 4,015,147 | 3/1977 | Davidson et al. ............ 357/42 |
| 4,035,826 | 7/1977 | Morton et al. .............. 357/42 |
| 4,053,925 | 10/1977 | Burr et al. ................ 357/42 |
| 4,137,545 | 1/1979 | Becke ....................... 357/15 |
| 4,152,717 | 5/1979 | Satou et al. ................ 357/42 |
| 4,203,126 | 5/1980 | Yim et al. .................. 357/42 |

OTHER PUBLICATIONS

Ames et al., IBM Technical Disclosure Bulletin, vol. 9, No. 10, Mar. 1967, p. 1470.
Dennehy, "Non-Latching Integrated Circuits", RCA Technical Note #872, Feb. 12, 1971.
Proc., IEEE, Aug. 1968, pp. 1400-1402.

*Primary Examiner*—William D. Larkins
*Attorney, Agent, or Firm*—Arthur J. Torsiglieri

[57] ABSTRACT

A CMOS integrated circuit structure which is not susceptible to latchup utilizes insulated-gate field-effect transistors having Schottky barrier source and drains (SB-IGFET). In the preferred embodiment, the n-channel device of an adjacent complementary pair of transistors in a CMOS circuit is provided with diffused source and drain while the p-channel device of the pair is provided with PtSi-Si Schottky barrier contact source and drain. Such a structure completely eliminates the parasitic pnpn structure which causes the latchup problem in conventional CMOS structures.

4 Claims, 5 Drawing Figures

PRIOR ART

COMPLEMENTARY FIELD-EFFECT TRANSISTOR INTEGRATED CIRCUIT DEVICE

BACKGROUND OF THE INVENTION

This invention relates to complementary field-effect transistor integrated circuit structures, and more particularly to the elimination of parasitic pnpn elements in such structures.

Integrated circuits using complementary metal-oxide-semiconductor (CMOS) transistors are well known. Such circuits which combine both p- and n-channel enhancement mode transistors on the same substrate chip offer high performance, low standby power dissipation, high noise immunity and single power supply operation. Owing to these desirable characteristics, CMOS circuits are now widely used in a variety of applications such as random access memories and microprocessors. At present, CMOS circuits having extremely high packing density of devices on a single chip are being developed.

One problem with CMOS circuits is that parasitic active elements which are inherently a part of conventional CMOS structures can cause very large currents to flow between the power supply terminals of the circuit. In a conventional CMOS structure, p-channel devices are formed in the surface of an n-type substrate wafer and n-channel devices are formed in the surface of a p-type "tub" region formed in the substrate. When a p-channel device and an n-channel device are placed in close proximity, the p-type source and drain regions of the p-channel device, the n-type bulk substrate region, the p-type bulk "tub" region and the n-type source and drain regions of the n-channel device form a pnpn structure which can operate as a silicon-controlled rectifier (SCR). This parasitic SCR can be triggered into a self-sustained high conductivity state, known as the latchup state, by noise signals of appropriate polarity and magnitude applied to the source or drain regions of the transistors. For example, latchup can be triggered by a noise transient pulse having a voltage whose magnitude exceeds that of the power supply voltage and which is picked up by an external terminal of a CMOS circuit. Once triggered, the parasitic SCR remains in the latchup state until the power supply voltages of the CMOS circuit are removed or are greatly reduced. The result of latchup is temporary malfunction of the CMOS circuit or, in some cases, permanent circuit damage.

Another characteristic of the latchup problem is that as the spacing between the p- and n-channel devices and the dimensions of the devices themselves are made smaller in order to achieve a higher packing density, the parasitic SCR becomes more easily triggered. Consequently, as the packing density of a conventional CMOS circuit is increased, the circuit becomes more susceptible to latchup. Therefore, the latchup problem also imposes a limitation on the maximum packing density achievable with conventional CMOS structures.

Heretofore, known solutions to the latchup problem in CMOS circuits have been directed towards making the parasitic SCR more difficult to trigger rather than towards totally eliminating the SCR structure itself. These solutions have included the use of heavily doped p-type and/or n-type guard regions for separating the p-channel devices from the n-channel devices, the use of a heavily doped p-type buried layer beneath the p-type "tub" region, and the use of an n-type epitaxial layer on a heavily doped n-type substrate as starting material for the CMOS circuit.

However, the increase in trigger threshold level for the parasitic SCR provided by each of the above techniques are offset by a decrease in the trigger threshold level as device spacings and dimensions are reduced to achieve a higher packing density. Therefore, while each of the previously known solutions provides adequate latchup protection for CMOS circuits at the present packing density they are less adequate for the circuits of higher packing density currently being developed. Thus, a need clearly exists for a CMOS structure which is incapable of latchup at any device packing density.

SUMMARY OF THE INVENTION

Accordingly, an object of this invention is a CMOS integrated circuit structure which eliminates the parasitic pnpn structures responsible for the latchup problem in conventional CMOS structures.

It is a further object of this invention to permit the packing density of CMOS integrated circuits to be increased by removing the limitation on the spacing between p- and n-channel devices and on the dimensions of the device regions imposed by the latchup problem.

In accordance with an illustrative embodiment a CMOS integrated circuit device comprises a silicon body having an n-type bulk region extending from a surface thereof and a p-type "tub" region extending from the surface, a pair of complementary transistors adjacent the surface, one of the pair being a p-channel device having spaced source and drain situated in the n-type bulk region, the other of the pair being a p-type device having spaced source and drain situated in the p-type bulk region, characterized in that at least one of the complementary pair of transistors is provided with a non-injecting source and drain whereby there are avoided the parasitic conditions which cause latchup.

For example, at least one of the complementary pair of transistors may be provided with a source and a drain each comprising a Schottky barrier connection. In such a configuration the parasitic pnpn structure is absent by virtue of the elimination of the p-type source and drain regions of the p-channel transistor and/or the n-type source and drain regions of the n-channel transistor and their replacement by appropriate Schottky barrier connections.

BRIEF DESCRIPTION OF THE DRAWING

The present invention will be better understood from the following more detailed description taken in conjunction with the accompanying drawing in which.

DETAILED DESCRIPTION

Figure 1:
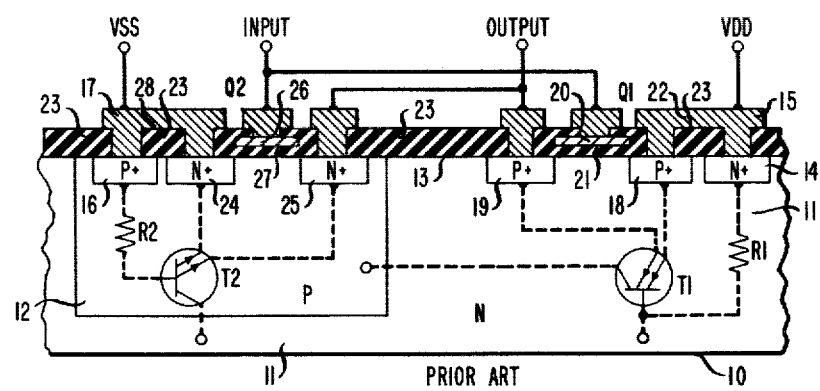
FIG. 1 is a cross-sectional side view depicting a silicon chip which incorporates an inverter circuit in a conventional CMOS structure, the figure also schematically depicting the parasitic elements associated with the conventional CMOS structure.

Referring now to FIG. 1 there is shown a conventional CMOS structure of the kind which is susceptible to the latchup problem. For purposes of illustration, the structure shown in FIG. 1 incorporates a CMOS inverter circuit shown schematically in FIG. 2. The circuit is formed using the well-known self-aligned silicon gate technology. A complementary pair of field-effect transistors Q1 and Q2 of the inverter circuit are formed on a silicon substrate 10. The substrate has an n-type bulk region 11 and a p-type "tub" region 12 both extending from a common surface 13. A heavily doped n-type region 14 and metallic contact 15 provide an ohmic electrical connection from a VDD supply terminal to the n-type bulk region 11. Similarly, a heavily doped p-type region 16 and a metallic contact 17 provide an ohmic electrical connection from a VSS supply terminal to the p-type "tub" region 12. Normally, the highest bias voltage of the circuit is applied to the VDD terminal and the lowest bias voltage of the circuit is applied to the VSS terminal.

The p-channel transistor Q1 comprises heavily doped source and drain regions 18 and 19 formed in the n-type bulk region 11, and a polycrystalline silicon gate electrode 20 overlying a gate insulator ($SiO_2$) layer 21. The source region 18 is connected to the VDD supply terminal via a metallic path 22, the drain region 19 is connected to an output terminal, and the gate electrode 20 is connected to an input terminal.

The n-channel transistor comprises source and drain regions 24 and 25, and a polycrystalline silicon gate electrode 26 overlying a gate insulator layer 27. The source region 24 is connected to the VSS supply terminal via a metallic path 28, the drain region 25 is connected to the output terminal and the gate electrode 27 is connected to the input terminal.

An appropriately formed field insulator ($SiO_2$) layer 23 provides electrical insulation between the silicon surface 13 and the metallic paths 22 and 28.

Parasitic elements which are inherently a part of the prior art CMOS structure are shown schematically in FIG. 1. They include a pnp bipolar transistor T1 having two emitters provided by regions 18 and 19, a base provided by a portion of region 11, and a collector provided by region 12; and an npn bipolar transistor having two emitters provided by regions 24 and 25, a base provided by a portion of region 12 and a collector provided by region 11. During operation of the CMOS circuit, the VDD supply voltage is applied directly to one emitter of T1 and to the base of T1 through a resistor R1 representing the resistance through region 11 between region 14 and the base of T1. The VSS supply voltage is applied directly to one emitter of T2 and to the base of T2 through a resistor R2 representing the resistance through region 12 between region 16 and the base of T2.

Figure 3:
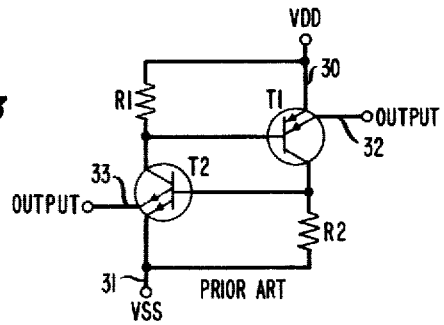
FIG. 3 is a schematic diagram of the equivalent circuit formed by the parasitic elements of the structure of FIG. 1.

Referring now to FIG. 3, there is shown, schematically, the circuit formed by the parasitic elements of the structure of FIG. 1. This circuit can be recognized as the well known equivalent circuit of a silicon controlled rectifier (SCR) having its anode 30 connected to the VDD supply, its cathode 31 connected to the VSS supply, and its anode gate 32 and cathode gate 33 both connected to a common terminal. Such a SCR circuit can be triggered into its conduction state by applying appropriate current signals to the anode gate 32 and/or the cathode gate 33 which are both connected to the output terminal of the inverter circuit. For example, if the output terminal of the CMOS circuit receives a transient pulse having a voltage sufficiently greater than VDD, T1 is driven into conduction causing current to flow through R2. If the current through R2 were sufficiently large, the voltage drop across R2 would drive T2 into conduction causing current to flow through R1. If the current through R1 were sufficiently large, the voltage drop across R1 would maintain T1 in its conduction state even after the transient pulse has passed. Thus, under appropriate conditions once the SCR circuit is triggered, each transistor acts to keep the other in its conduction state and the SCR circuit remains latched until the bias voltage across the circuit (VDD-VSS) is interrupted or reduced below a level required to sustain conduction. The SCR circuit may also be triggered by a transient pulse having a voltage sufficiently lower than VSS which when applied to the output terminal would initiate latchup by driving T2 into conduction.

A known condition which must be satisfied before latchup can occur in an SCR circuit is that the product of the common emitter dc current gains (this parameter is commonly referred to as $\beta$) of transistors T1 and T2 must be equal to or greater than one. This condition is easily met in most conventional CMOS structures. The above-discussed known techniques for avoiding latchup in CMOS circuits are all primarily directed towards reducing the product of the $\beta$'s of parasitic transistors T1 and T2 to be less than one. However, owing to the fact that the $\beta$ of each parasitic transistor increases rapidly as the dimensions of the CMOS structure are reduced, these techniques become inadequate for circuits of very high packing density.

The present invention provides a solution to the latchup problem which is effective for circuits of any packing density. The solution is based on the elimination of the parasitic circuit of FIG. 3. This is achieved by a structure in which preferabvly at least one of a pair of complementary field-effect transistors comprise source and drain connections which are incapable of injecting minority carriers into the underlying bulk region.

Figure 2:
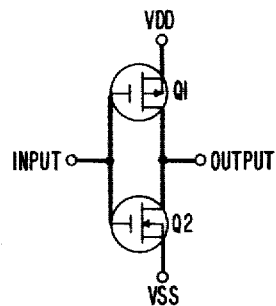
FIG. 2 is a schematic diagram of a known CMOS inverter circuit.
Figure 4:
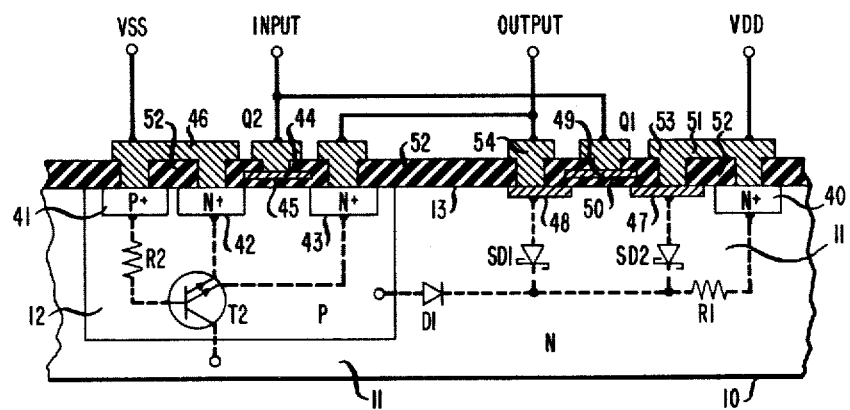
FIG. 4 is a cross-sectional side view depicting a silicon chip incorporating the inverter circuit of FIG. 2 in a CMOS structure according to the present invention, the figure also schematically depicting the parasitic elements associated with the structure shown.

Referring now to FIG. 4, there is shown the preferred embodiment of the instant invention. As with the structure shown in FIG. 1, the CMOS inverter of FIG. 2 is formed in a silicon substrate 10. The substrate has a n-type bulk region 11 which is electrically connected to the VDD supply terminal through a n-type contact region 40 and a p-type "tub" region 12 which is electrically connected to the VSS supply terminal through a p-type contact region 41. The n-channel transistor Q2 as before comprises heavily doped n-type source and drain regions 42 and 43 formed in the p-type tub region 12, and a polycrystalline silicon gate 44 overlying a gate insulator region 45. The source region 42 is electrically connected to the VSS supply terminal via a metallic path 46 and the drain region 43 is electrically connected to the output terminal.

The p-channel transistor Q2 comprises platinum silicide (PtSi) Schottky barrier source and drain connections formed by thin PtSi layers 47 and 48 which are in contact with the surface of the lightly doped n-type bulk region 11, and a polycrystalline silicon gate 49 overlying a gate oxide layer 50. The PtSi layer is typically about 275 Angstroms thick. The formation of a Schottky barrier connection with PtSi on n-type silicon is known. A method for making such connections is described in U.S. Pat. No. 3,652,908 in the names of the present inventor and A. U. MacRae.

The source connection 47 is electrically connected to the VDD supply terminal via a metallic path 51 and the drain connection 48 is electrically connected to the output terminal. An appropriately formed field $SiO_2$ layer 52 provides electrical insulation between the semiconductor surface and the metallic paths 46 and 51. In the preferred embodiment the metallic contacts and paths are formed with aluminum.

Insulated-gate field-effect transistors which use Schottky barrier contacts for the source and drain (sometimes referred to as SB-IGFETs) are now well known. The characteristics of SB-IGFETs are described in a paper co-authored by the present inventor and S. M. Sze entitled "SB-IGFET: An Insulated-Gate Field Effect Transistor Using Schottky Barrier Contacts as Source and Drain" published in the *Proceedings of The IEEE*, Vol. 56, Aug. 1968 pages 1400 through 1402. However, such devices have heretofore not been used in complementary field-effect transistor circuits nor has the advantageous use of such devices to provide a CMOS circuit configuration free of parasitic SCR structures been previously recognized.

The Schottky barrier source and drain connections of transistor Q1 are advantageously formed with PtSi-Si contacts which have a barrier height of 0.85 eV on n-type Si and 0.24 eV on p-type Si, the lower barrier height being operative to provide electrical conduction between the source connection and a p-type inversion layer formed in the surface of the n-type silicon.

The process used to fabricate the structure of FIG. 4 is a modification of that used to fabricate the conventional CMOS structure of FIG. 1. The modifications include the omission of the steps for forming the p-type source and drain regions of the p-channel transistor and the addition of steps for forming a PtSi layer over those portions of the silicon surface in which the p-type source and drain regions would have been formed. Aluminum contacts 53 and 54 are made directly to the PtSi layers.

The parasitic elements associated with the preferred embodiment are shown schematically in FIG. 4. Owing to the absence of the p-type source and drain regions of Q1, the parasitic pnp transistor normally associated with the p-channel device has been eliminated and is replaced by Schottky diodes SD1 and SD2 which do not inject minority carriers into the n-type bulk region 11. Since the source and drain regions of the n-channel device Q2 have not been eliminated, the parasitic npn transistor T2 remains.

Figure 5:
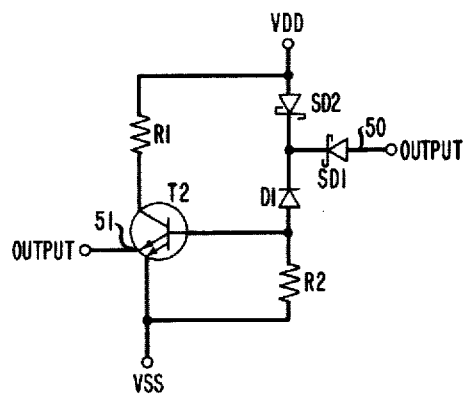
FIG. 5 is a schematic diagram of the equivalent circuit formed by the parasitic elememts of the structure of FIG. 4.

The circuit formed by the parasitic elements of the preferred embodiment is illustrated schematically in FIG. 5. Unlike the SCR circuit of FIG. 3, this circuit cannot be triggered into a high conduction state by transient pulses on the output terminal. While a transient pulse having a voltage sufficiently lower than VSS when applied to the emitter 51 of T2 would cause conduction between the VDD and VSS terminals through T2, this conduction is not self-sustained after the transient pulse has passed. Therefore, the structure of FIG. 4 is incapable of latchup caused by parasitic elements in the structure regardless of how much the $\beta$ of T2 is increased by reduction in the spacing between complementary devices and in the dimensions of the device regions.

In some instances it may be preferrable to provide the n-channel transistor with appropriately formed Schottky barrier contact source and drain instead of the p-channel transistor. In other instances it may be preferrable to use SB-IGFETs for both the p- and n-channel transistors. In either instance the parasitic SCR structure would be eliminated in accordance with the present invention.

It will be appreciated that the circuit structure shown in FIG. 4 represents only a small portion of a CMOS integrated circuit which would typically include many more complementary pairs of transistors, and that the invention is applicable not only to the inverter circuit but to other forms of complementary IGFET circuits as well. For some applications it may not be necessary to provide latchup protection to all adjacent complementary pairs of transistors in the circuit where only those pairs which have their drains connected to the external terminals of the circuit chip are subject to transient noise pulses which can cause latchup. Therefore, for such circuits it may be preferrable to provide only those pairs of complementary transistors having drains connected to external terminals with SB-IGFETs.

It will be understood by those skilled in the art that the foregoing and other modifications and changes may be made to the described embodiments without departing from the spirit and scope of the invention. For example, numerous metal-semiconductor systems may be used to form appropriate Schottky barrier connections for the transistors; the complementary IGFET circuit may be formed by providing an n-type tub region in a p-type bulk region, the bulk region in which the circuit is formed may be an epitaxial layer; other materials may be substituted for the substrate, the gate insulator layer, the field insulator layer, and the gate electrode; and numerous techniques are available for forming the various regions of the device.

Although the preferred embodiment utilizes SB-IGFETs to avoid the latchup problem, the use of other types of field-effect transistors having non-injecting source and drain is also within the contenplation of the present invention.

I claim:

1. A complementary field-effect transistor integrated circuit device comprising a semiconductive body having a first bulk region of one conductivity type extending from a surface of the body; a second bulk region, of a conductivity type which is opposite to the one type, extending from the surface; and a pair of complementary transistors adjacent the surface, one of the pair being of the opposite channel conductivity type and having spaced source and drain situated in the first bulk region, the other of the pair being of the one channel conductivity type and having spaced source and drain situated in the second bulk region;

characterized in that the source and drain of at least one of the complementary pair of transistors each consists of a connection that is substantially incapable of injecting minority carriers when forward biased with respect to the bulk region in which the connection is situated whereby there are avoided the parasitic conditions for latchup.

2. An integrated circuit device of claim 1 further characterized in that the connection that is substantially incapable of injecting minority carriers is a Schottky barrier connection.

3. An integrated circuit device of claim 1 wherein the one conductivity type is n-type and the opposite conductivity type is p-type and further characterized in that the source and drain of the n-channel conductivity type transistor each comprise a relatively heavily doped n-type region formed in the second bulk region and further characterized in that the source and drain of the p-channel conductivity type transistor each consists of a Schottky barrier connection made to the surface of the first bulk region.

4. The integrated circuit device of claim 3 wherein the semiconductive body is silicon and further characterized in that Schottky barrier connections of the source and drain of the p-channel conductivity type transistor each comprise a PtSi layer in contact with the surface of the first bulk region.

* * * * *